(12) United States Patent
Tanabe et al.

(10) Patent No.: US 11,291,124 B2
(45) Date of Patent: *Mar. 29, 2022

(54) METHOD FOR MANUFACTURING MULTILAYER WIRING BOARD

(71) Applicant: Lincstech Co., Ltd., Tokyo (JP)

(72) Inventors: Yuto Tanabe, Tokyo (JP); Eiichi Shinada, Tokyo (JP); Masahiro Kato, Tokyo (JP)

(73) Assignee: Lincstech Co., Ltd., Tokyo (JP)

( * ) Notice: Subject to any disclaimer, the term of this patent is extended or adjusted under 35 U.S.C. 154(b) by 364 days.

This patent is subject to a terminal disclaimer.

(21) Appl. No.: 16/307,505

(22) PCT Filed: Jun. 5, 2017

(86) PCT No.: PCT/JP2017/020830

§ 371 (c)(1),
(2) Date: Dec. 6, 2018

(87) PCT Pub. No.: WO2017/213085

PCT Pub. Date: Dec. 14, 2017

(65) Prior Publication Data

US 2019/0313536 A1 Oct. 10, 2019

(30) Foreign Application Priority Data

Jun. 6, 2016 (JP) .............................. JP2016-112673

(51) Int. Cl.
*H05K 3/46* (2006.01)
*H05K 3/10* (2006.01)

(52) U.S. Cl.
CPC ........... *H05K 3/4623* (2013.01); *H05K 3/107* (2013.01); *H05K 3/46* (2013.01); *H05K 3/4614* (2013.01)

(58) Field of Classification Search
CPC ...... H05K 3/4623; H05K 3/107; H05K 3/462; H05K 3/4614; H05K 3/0026;
(Continued)

(56) References Cited

U.S. PATENT DOCUMENTS

2003/0102151 A1* 6/2003 Hirose ............... H05K 1/03
174/250
2006/0029726 A1* 2/2006 Mok ................. H05K 3/462
427/96.1

(Continued)

FOREIGN PATENT DOCUMENTS

JP    H09-162553 A    6/1997
JP    H11-87870 A     3/1999
(Continued)

OTHER PUBLICATIONS

International Preliminary Report on Patentability dated Dec. 11, 2018 for PCT/JP2017/020830.

*Primary Examiner* — Minh N Trinh
(74) *Attorney, Agent, or Firm* — Faegre Drinker Biddle & Reath LLP

(57) ABSTRACT

A method for manufacturing a multilayer wiring board is disclosed. The Method comprises a step (I) of preparing printed wiring boards having both electrical connection pads for establishing an electrical connection between the boards and non-connection pads for not establishing an electrical connection between the boards on the same plane; and a lamination step (II) of overlaying the boards so that the electrical connection pads face each other, and laminating the boards so that the boards are bonded to each other through a conductive material provided between the facing electrical connection pads. In the step (I), to at least one of surfaces faced when the boards are overlaid in the step (II), an insulating film having through holes formed in positions corresponding to the electrical connection pads on the surface is attached (Ia), and the conductive material is provided in the through holes (Ib).

10 Claims, 4 Drawing Sheets

(58) Field of Classification Search
CPC .... H05K 3/0047; H05K 3/429; H05K 3/4626; H05K 1/0373; H05K 2201/0959; H05K 2203/1105
See application file for complete search history.

(56) References Cited

U.S. PATENT DOCUMENTS

| | | | | |
|---|---|---|---|---|
| 2006/0272850 | A1* | 12/2006 | Morimoto | H05K 3/4617 |
| | | | | 174/254 |
| 2012/0006587 | A1* | 1/2012 | Ito | H01L 23/5385 |
| | | | | 174/257 |
| 2012/0111616 | A1* | 5/2012 | Inoue | B23K 1/0016 |
| | | | | 174/257 |
| 2019/0350083 | A1* | 11/2019 | Kato | H05K 3/4007 |

FOREIGN PATENT DOCUMENTS

| | | | |
|---|---|---|---|
| JP | 2000-286553 | A | 10/2000 |
| JP | 2001-160686 | A | 6/2001 |
| JP | 2002-198652 | A | 7/2002 |
| JP | 2002-198656 | A | 7/2002 |
| JP | 2002-329967 | A | 11/2002 |
| JP | 2003-334886 | A | 11/2003 |
| JP | 2004-288989 | A | 10/2004 |
| JP | 2004288989 | A * | 10/2004 |
| JP | 2007-335701 | A | 12/2007 |
| JP | 5874343 | B2 | 3/2016 |
| TW | 200803642 | A | 1/2008 |
| TW | 201315318 | A | 4/2013 |

* cited by examiner (A)

(B)

METHOD FOR MANUFACTURING MULTILAYER WIRING BOARD

TECHNICAL FIELD

The present invention relates to a method for manufacturing a multilayer wiring board.

BACKGROUND ART

A conventional method for manufacturing a multilayer wiring board typically provides a multilayer wiring board which is an integrated laminate in which double-sided copper-clad laminates on which a circuit is formed and insulating adhesive layers alternate, and has a structure (through-holes) such that holes passing through the multilayer wiring board are formed in needed portions and the interior walls of the holes are plated so that an electrical connection is established between circuits on the respective layers.

In addition, examples of a countermeasure for increasing the density of components to be mounted on the multilayer wiring board include multilayer wiring boards having interstitial via holes (IVH: non-through holes for connections only between specific interlayers) in which a plurality of printed wiring boards each having through holes are laminated and integrated to form a multilayer wiring board, and to establish electrical connections between the plurality of printed wiring boards, through holes are formed by boring holes through the entire board thickness of the multilayer wiring board in needed positions. In a multilayer wiring board with IVH, smaller-diameter holes can be bored than in a multilayer wiring board in which electrical connections are established through holes through the entire board thickness, and smaller-pitches can therefore be achieved.

For higher density, a technique for interlayer connection through non-through holes which is used to establish a connection only between the adjacent layers has been proposed. An example is the so-called build-up process in which build-up layers with wiring formed on its surface are formed on insulating substrates provided with circuits, non-through holes (holes passing through only each build-up layer) are formed by laser beams or the like, the interior walls thereof are plated to establish connections, and build-up layers are sequentially built up according to the number of needed layers. As a technique for interlayer connection other than the build-up process, companies have proposed techniques for manufacturing a multilayer wiring board with a through-hole-less structure using a conductive paste, an anisotropic conductive material, or the like as an interlayer connecting material without plating. Well-known examples are given below.

Patent Literature 1 discloses a method for manufacturing a multilayer wiring board by boring holes in a thin prepreg, which is prepared by impregnating a non-woven fabric with a thermosetting resin so that it is set in the semi-cured state; filling the holes with a conductive paste; laminating two double-sided circuit boards with the prepreg therebetween; heating and pressurizing the workpiece for adhesion such that the circuits on the two double-sided circuit boards are electrically connected to each other through the conductive paste in the hole in the prepreg.

Patent Literature 2 discloses a method for forming an interlayer connection part consisting of conductive bumps, by forming conductive bumps, which have a mountain shape or a substantially conical shape, on a conductive plate, and press-inserting the conductive bumps in an insulating prepreg substrate which is softened by heating.

Patent Literature 3 discloses a method for manufacturing a multilayer wiring board by providing an adhesive resin sheet, which has odd-shaped via holes with an opening area determined according to the conductor area rate, between circuit boards having a plurality of regions with different conductor area rates, filling the odd-shaped via holes with a conductive paste, and hot-pressing the workpiece.

CITATION LIST

Patent Literature

Patent Literature 1: Japanese Unexamined Patent Publication No. H11-87870
Patent Literature 2: Japanese Unexamined Patent Publication No. H9-162553
Patent Literature 3: Japanese Patent No. 5874343

SUMMARY OF INVENTION

Technical Problem

Most components designed to be mounted on multilayer wiring boards are based on surface mount technology, and connection terminals for establishing a connection between components and multilayer wiring boards have been made smaller year by year. Further, as the number of mount components has been increasing year by year, it has been required to reduce the pitch of holes for an electrical connection in multilayer wiring boards and to increase the number of signal lines.

In the field of large and thick multilayer wiring boards having a board thickness of greater than 5 mm, typified by mother boards and boards for jigs for semiconductor testing, it has been required to reduce the pitch of the holes for an electrical connection in multilayer wiring boards, to increase the number of signal lines, and the like along with the miniaturization and pitch reduction of the inspection parts and mounted parts.

Forming a small-diameter through hole in a board with a large board thickness has a risk of drill breaking and also has a problem in the accuracy of alignment for forming the through hole from the front and back sides. Besides, it is difficult to form plating with preferred throwing power, which is the ratio of plating thicknesses in the vicinity of the entrance of the through hole and in the central part of the through hole at the time of plating; thus, it would conventionally be very difficult to manufacture a board with an aspect ratio (the value obtained by dividing the board thickness by the diameter of the through hole) exceeding 25. For this reason, regarding a multilayer wiring board in which interlayer connection is achieved only by a through-hole structure with holes passing through the entire board thickness, it is difficult to provide a multilayer wiring board in which the pitch can be reduced due to an increase in the aspect ratio; therefore, the methods of manufacturing multilayer wiring boards described in Patent Literatures 1 to 3 and the like have been proposed.

In the method for manufacturing a multilayer wiring board disclosed in Patent Literature 1, interlayer connection is achieved using a conductive paste filled in holes in a prepreg containing a nonwoven fabric, so that the height (distance) of the connected interlayer varies due to variations in the thickness of the nonwoven fabric due to the unevenness of density; thus, the connection resistance value may be unstable. For this reason, it is probably difficult to perform machining with high positional accuracy for a multilayer wiring board in which mounted parts having minute junction terminal pitches are mounted at high density.

In the method of manufacturing a multilayer wiring board disclosed in Patent Literature 2, the bumps may not properly pass through due to the bump height and the warpage of the substrate, and ease of passing them through varies the due to variations in the thickness of the nonwoven fabric due to the unevenness of density. For this reason, problems may arise in terms of yield and reliability.

In the method for manufacturing a multilayer wiring board disclosed in Patent Literature 3, an adhesive resin sheet provided with odd-shaped via holes having different opening area rates to be filled with a conductive material is used, voids tend to be formed near the odd-shaped via holes at the time of filling with a conductive material, and the voids cause a flow of the conductive material, so that a short circuit failure may occur.

An object of the present invention, which has been made in consideration of the above situation, is to provide a manufacturing method for easily fabricating a high-density multilayer wiring board having excellent connection reliability, a large plate thickness, small-diameter holes with small pitches for electrical connections, and minute junction terminal pitches.

Solution to Problem

A method for manufacturing a multilayer wiring board of the present invention relates to the following aspects.

1. A method for manufacturing a multilayer wiring board, comprising: a printed wiring board manufacturing step (I) of preparing a plurality of printed wiring boards having both electrical connection pads for establishing an electrical connection between the printed wiring boards and non-connection pads for not establishing an electrical connection between the printed wiring boards on the same plane; and a lamination step (II) of overlaying the plurality of printed wiring boards so that the electrical connection pads face each other, and laminating the plurality of printed wiring boards so that the printed wiring boards are bonded to each other through a conductive material provided between the facing electrical connection pads, wherein in the printed wiring board manufacturing step (I), to at least one of surfaces faced when the plurality of printed wiring boards are overlaid in the lamination step (II), an insulating film having through holes formed in positions corresponding to the electrical connection pads on the surface is attached (Ia), and a conductive material is provided in the through holes formed in the insulating film (Ib).

2. The method for manufacturing a multilayer wiring board according to Aspect 1, wherein in the printed wiring board manufacturing step (I), the insulating film includes a thermosetting resin composition having a glass transition temperature of 180° C. or more.

3. The method for manufacturing a multilayer wiring board according to Aspect 1 or 2, wherein in the printed wiring board manufacturing step (I), the insulating film includes particles, such as a filler as a reinforcement.

4. The method for manufacturing a multilayer wiring board according to any one of Aspects 1 to 3, wherein in the printed wiring board manufacturing step (I), the through holes in the insulating film in the positions corresponding to the pads for establishing an electrical connection between the printed wiring boards are formed by laser hole-boring or drilling hole-boring.

5. The method for manufacturing a multilayer wiring board according to any one of Aspects 1 to 4, wherein in the printed wiring board manufacturing step (I), a PET film is used as a protective mask when the conductive material is provided in the through holes limited in the insulating film (Ib).

6. The method for manufacturing a multilayer wiring board according to any one of Aspects 1 to 5, wherein in the printed wiring board manufacturing step (I), the printed wiring boards are subjected to heat treatment at a temperature of 70 to 150° C. for 10 to 120 minutes, after the conductive material is provided in the through holes formed in the insulating film (Ib) and before the step (II) of laminating the plurality of printed wiring boards.

7. The method for manufacturing a multilayer wiring board according to any one of Aspects 1 to 6, wherein in the printed wiring board manufacturing step (I), insulating films are attached to both of the facing surfaces when the plurality of printed wiring boards are overlaid in the lamination step (II), the insulating film having through holes provided in positions corresponding to only the electrical connection pads is used for one of the surfaces, and the insulating film having through holes provided in positions corresponding to both the electrical connection pads and the non-connection pads is used for the other surface.

8. The method for manufacturing a multilayer wiring board according to any one of Aspects 1 to 7, wherein in the lamination step (II), a plurality of alignment holes are provided in common portions on the planes of the plurality of printed wiring boards, and pins are inserted into the provided alignment holes, so that the lamination is performed while performing alignment between the printed wiring boards.

9. The method for manufacturing a multilayer wiring board according to any one of Aspects 1 to 8, wherein in the lamination step (II), portions on the surface provided with the electrical connection pads are filled with an insulating material, the portions being not provided with the electrical connection pads.

10. The method for manufacturing a multilayer wiring board according to any one of Aspects 1 to 9, wherein in the printed wiring board manufacturing step (I), upon attachment of the insulating film with the through holes (Ia), a thickness of the insulating film attached to the printed wiring board is larger than a pad thickness of the electrical connection pads exposed from the through holes formed in the insulating film.

11. The method for manufacturing a multilayer wiring board according to any one of Aspects 1 to 10, wherein in the printed wiring board manufacturing step (I), when the conductive material is provided in the through holes (Ib), the through holes formed in the insulating film in positions corresponding to the electrical connection pads are all filled by providing the conductive material.

Advantageous Effects of Invention

The present invention can provide a manufacturing method in which at least two printed wiring boards are integrally laminated together and an electrical connection is established between the printed wiring boards, thereby easily fabricating a high-density multilayer wiring board having excellent connection reliability, a large board thickness, small-diameter holes with small pitches for electrical connections, and minute junction terminal pitches.

DESCRIPTION OF EMBODIMENTS

Figure 1:
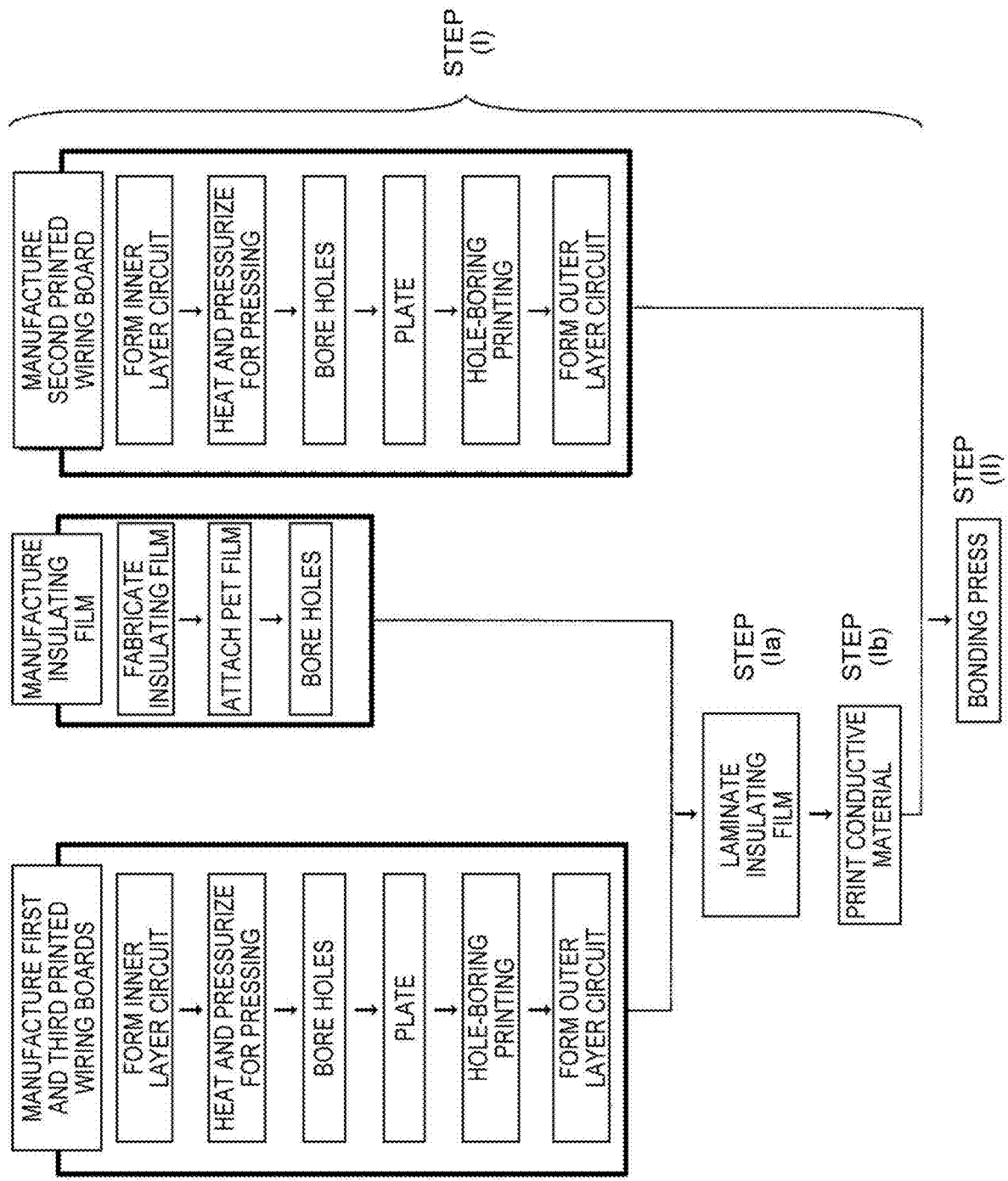
FIG. 1 is a flow chart showing the flow of one embodiment of a method of manufacturing a multilayer wiring board of the present invention.

Embodiments of a method for manufacturing a multilayer wiring board of the present invention will now be described with reference to the drawings, but the present invention is not limited to them. An example of a method for manufacturing a multilayer wiring board in which three printed wiring boards are integrally laminated together is shown below, and the printed wiring boards before integral lamination are shown as a first printed wiring board 8, a second printed wiring board 9, and a third printed wiring board 10.

A method for manufacturing a multilayer wiring board of this embodiment comprises: a printed wiring board manufacturing step (I) of preparing a first, second, and third printed wiring boards having both electrical connection pads for establishing an electrical connection between the printed wiring boards and non-connection pads for not establishing an electrical connection between the printed wiring boards on the same plane; and a lamination step (II) of overlaying the plurality of printed wiring boards so that the electrical connection pads face each other, and laminating the plurality of printed wiring boards so that the printed wiring boards are bonded to each other through a conductive material provided between the facing electrical connection pads, wherein in the printed wiring board manufacturing step (I), to at least one of surfaces faced when the plurality of printed wiring boards are overlaid in the lamination step (II), an insulating film having through holes formed in positions corresponding to the electrical connection pads on the surface is attached (Ia), and the conductive material is provided in the through holes formed in the insulating film (Ib).

In this embodiment, "electrical connection pads" refer to pads that establish an electrical connection between printed wiring boards, and are layered so that they face each other with a conductive material, which will be described later, interposed therebetween, and since the pads are laminated so that they are bonded to each other through the conductive material, an electrical connection is established between the printed wiring boards. In contrast, "non-connection pads" refer to pads that are not used to establish an electrical connection between printed wiring boards. In addition, "the first, second, and third printed wiring boards having both the electrical connection pads and the non-connection pads on the same plane" means that the plurality of printed wiring boards, i.e., the first, second, and third printed wiring boards each have both the electrical connection pads and the non-connection pads on at least one of the front and back surfaces thereof, and each of the printed wiring boards may have both the electrical connection pads and the non-connection pads on one of the front and back surfaces thereof but on a different surface from another printed wiring board. For example, the first printed wiring board may have both electrical connection pads and non-connection pads on its front surface, and the second printed wiring board and the third printed wiring board may have both electrical connection pads and non-connection pads on their back surfaces.

<Printed Wiring Board Manufacturing Step (I)>
(Preparation of Printed Wiring Board)

Figure 2:
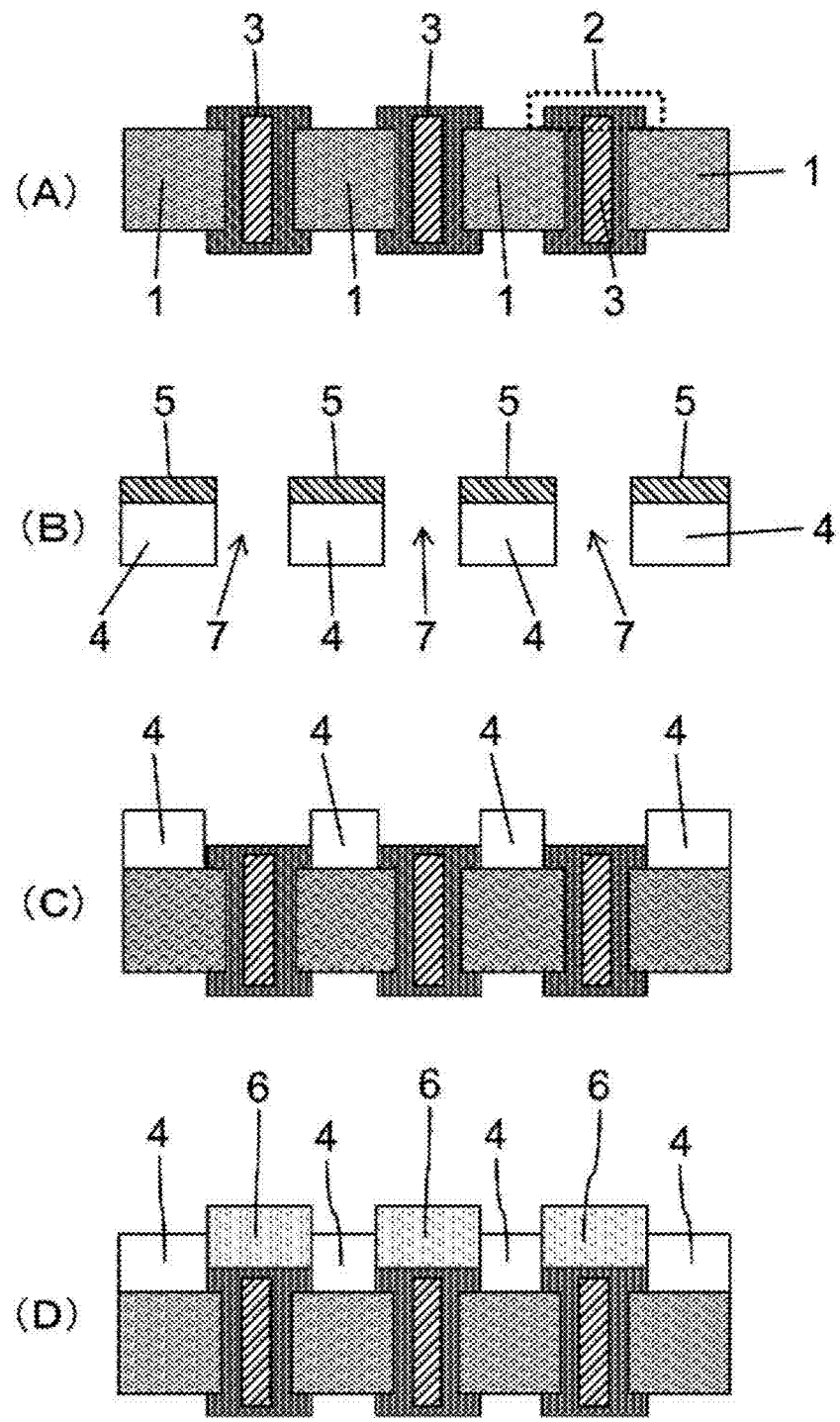
FIG. 2 shows a printed wiring board manufacturing step (I) in one embodiment of a method for manufacturing a multilayer wiring board of the present invention. (A) is a schematic cross-sectional view showing prepared first, second, and third printed wiring boards. (B) is a schematic cross-sectional view showing the state where through holes are formed in an insulating film with a protective mask attached to it. (C) is a schematic cross-sectional view showing the state (Ia) where the insulating film having through holes is attached to the printed wiring board. (D) is a schematic cross-sectional view showing the state (Ib) where a conductive material is provided in the through holes faulted in the insulating film.
Figure 3:
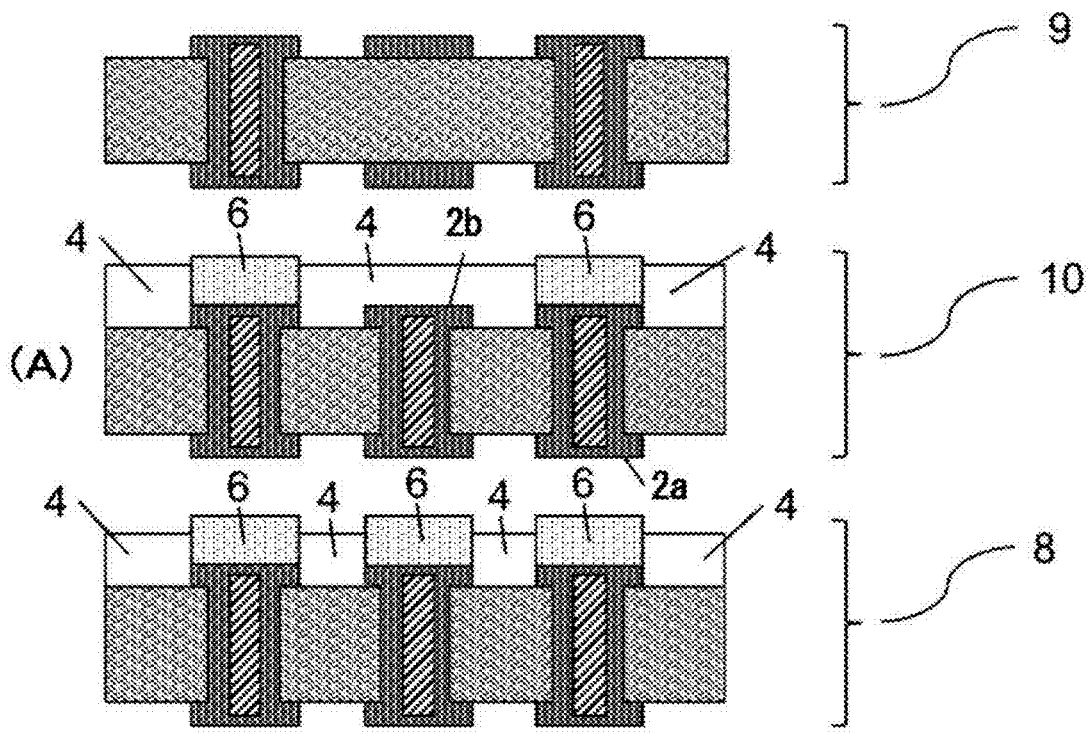
FIG. 3 shows a lamination step (II) of one embodiment of a method for manufacturing a multilayer wiring board of the present invention. (A) is a schematic cross-sectional view showing the state (IIa) where the three printed wiring boards, i.e., the first, second, and third printed wiring boards are overlaid on one another so that the surface on which the conductive material is provided and the surface on which no conductive material is provided face to each other. (B) is a schematic cross-sectional view showing the state (11b) after lamination by heating and pressurization.
Figure 3:
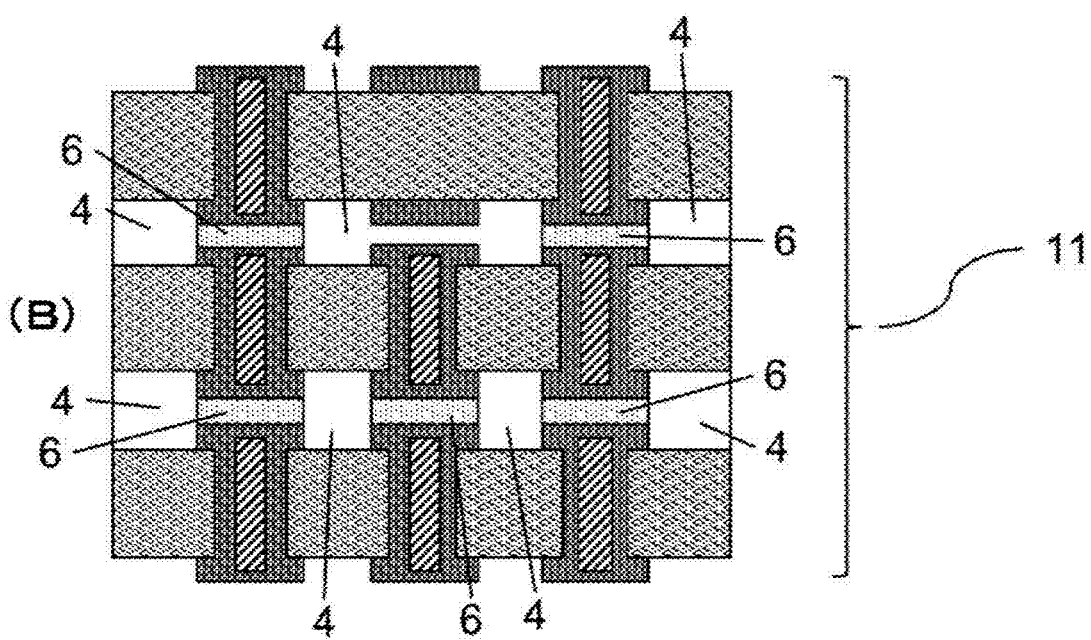

The steps of a method for manufacturing a multilayer wiring board will be described with reference to FIGS. 1 to 3. First, a first printed wiring board 8, a second printed wiring board 9, and a third printed wiring board 10 are manufactured. Each printed wiring board may be either a double-sided circuit board, a multilayer wiring board, or a multi-wire wiring board on which a needed wiring pattern is formed using insulated wires. Although there are no restrictions on the type of support base material 1 used for the printed wiring boards, in order to control deformation (dimensional change) due to pressure heating during lamination, it is preferable to use an insulating base material containing a reinforcing material, such as glass cloth, particularly a base material of flame retardant (FR)-5 grade according to the National Electrical Manufacturers Association (NEMA) standard, or a base material having a high glass transition temperature, such as a polyimide resin-based material.

It is preferable that the first printed wiring board 8, the second printed wiring board 9, and the third printed wiring board 10 be printed wiring boards in which holes bored so that they pass through the printed wiring boards are coated with electrolytic copper plating or electroless copper plating as shown in FIG. 2(A), and are filled with a nonconductive material (hole-filling resin 3) and covered with a metal layer so that it is connected to the plating layer in the through holes, i.e., furnished with hole filling and lid plating. This is because when the holes bored so that they pass through the printed wiring boards are left filled with the hole-filling resin 3 without providing lid plating, the central parts of the pads 2 are composed of a nonconductive material and the contact area between the conductive material needed for a connection between the printed wiring boards and the connection parts of the printed wiring boards may decrease.

It is preferable that the surface finish of the first printed wiring board 8, the second printed wiring board 9, and the third printed wiring board 10 be gold plating. In general, copper plating is often used for ensuring the connectivity of the through hole and for lid plating. However, copper plating left in the atmosphere may be covered with a copper oxide film and its connectivity with the conductive material 6 may decrease in some cases. It is preferable that a protective coating film of a material such as gold be present on the surface in order to suppress poor connectivity due to oxidative deterioration. The dashed line indicated by the pad 2 in FIG. 2(A) shows the case where it has a protective coating film, but such a dashed line is omitted for other pads.

Pads 2 are formed on a surface on which the first printed wiring board 8, the second printed wiring board 9, and the third printed wiring board 10 are electrically connected to each other. In addition to electrical connection pads, non-connection pads and lands and, as needed, wiring may be provided on the surface to be electrically connected.

(Manufacture of Insulating Film)

Next, as shown in FIG. 2(B), an insulating film 4 to be attached to at least one of the facing surfaces of the printed wiring boards is fabricated. Through holes 7 are formed in the insulating film 4 in the positions corresponding to the electrical connection pads on the first printed wiring board 8, the second printed wiring board 9, and the third printed wiring board 10. The through holes 7 provided in the insulating film 4 may be opened by any method, for example, drilling hole-boring or laser hole-boring. In order to suppress adhesion of foreign substances to the insulating film 4 at the time of hole-boring, it is preferred that release films 5 (for example, PET films) be attached to both sides of the insulating film 4. Foreign substances can be prevented from adhering to the surface of the insulating film 4 in each step, and at the time of providing the conductive material 6 thereafter, a release film 5 in which holes are bored can be used instead of a protective mask without preparing a dedicated protective mask in which openings are formed in the positions corresponding to the positions of the conductive material 6 for each product pattern, thereby reducing the manufacturing cost. As the release film 5, one-side release PET film A-53 (product name) manufactured by Teijin DuPont Films may be used, for example.

In hole-boring for the insulating film 4, it is sufficient to bore holes in the positions corresponding to electrical connection pads; however, in order to fabricate a printed wiring board with excellent positional accuracy and excellent connection reliability, it is preferable to bore holes with an opening diameter that is 0 to 200 µm larger than the diameter of the electrical connection pads, and it is more preferable to bore holes with an opening diameter that is 25 to 75 µm larger than the diameter of the electrical connection pads. Further, in a printed wiring board having both electrical connection pads and non-connection pads on the same plane, in order to ensure a sufficient insulation distance of the non-connection pads, it is preferable that the holes bored in the insulating film 4 attached to at least one of the facing surfaces of the first printed wiring board 8 and the third printed wiring board 10 be located in the positions corresponding to the electrical connection pads provided on the surface to which it is attached.

(Attachment of Insulating Film (1a))

Next, as shown in FIG. 2(C), an insulating film 4 having through holes 7 is attached to the positions, which correspond to the electrical connection pads, on the surface of the first printed wiring board 8 on which the electrical connection pads are provided. It is preferable that the insulating film 4 be attached to at least one of the facing surfaces of the printed wiring board 8 and the third printed wiring board 10, and it is more preferable that the insulating film 4 be attached to both of the facing surfaces of the first printed wiring board 8 and the third printed wiring board 10.

Further, as in the first printed wiring board 8 and the third printed wiring board 10, in the second printed wiring board 9 and the third printed wiring board 10, it is preferable to attach the insulating film 4 to at least one of the facing surfaces of the second printed wiring board 9 and the third printed wiring board 10, and it is more preferable to attach the insulating film 4 to both of the facing surfaces of the second printed wiring board 9 and the third printed wiring board 10.

Figure 4:
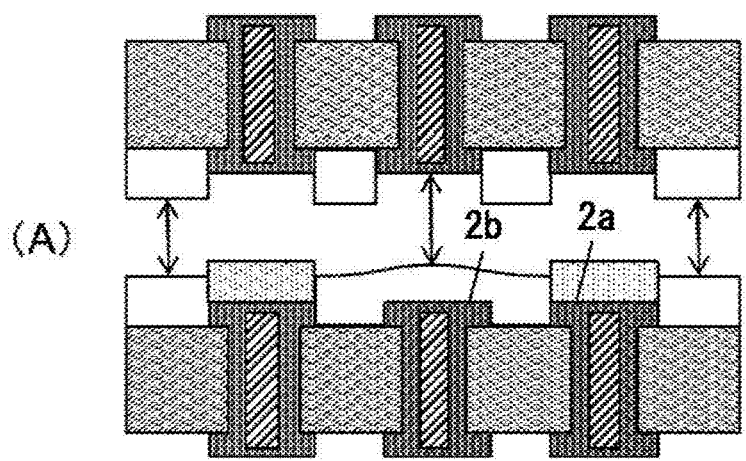
FIG. 4 (A) is a schematic cross-sectional view showing the case where insulating films are attached to both of the facing surfaces of the printed wiring boards, and an insulating film in which holes are bored in positions corresponding to only the electrical connection pads and an insulating film in which holes are bored in positions corresponding to both the electrical connection pads and the non-connection pads are attached. (B) is a schematic cross-sectional view showing the case where insulating films are attached to both of the facing surfaces of the printed wiring boards, and insulating films in which holes are bored in positions corresponding to only the electrical connection pads are attached.
Figure 4:
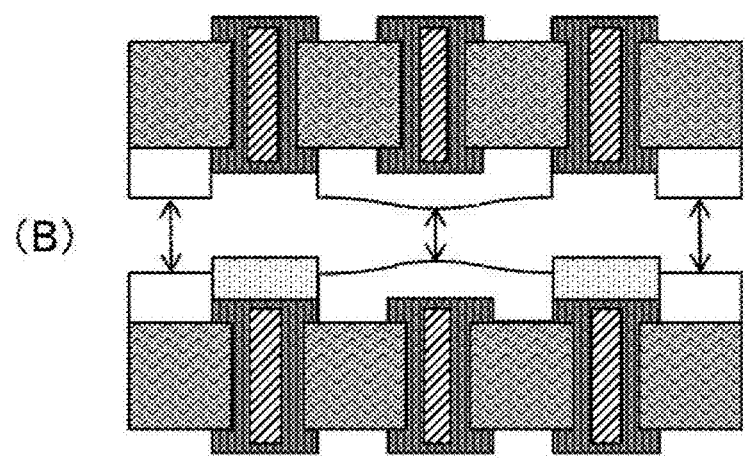

In the case where the insulating film 4 is attached to both of the facing surfaces, as shown in FIG. 4(A), it is preferable that the attached insulating film 4 in which the conductive material 6 is provided be the insulating film 4 in which holes are bored in the positions corresponding to only electrical connection pads, and the attached insulating film 4 in which no conductive material 6 is provided be the insulating film 4 in which holes are bored in the positions corresponding to both electrical connection pads and non-connection pads. In the case where insulating films 4 with through holes 7 bored only in the positions corresponding to the electrical connection pads are provided on both of the facing surfaces, the actual interlayer distance differs between the positions where the non-connection pads face each other and the positions where the electrical connection pads face each other (FIG. 4(B)), so that a connection failure may occur when they are bonded to each other; however, when the insulating films shown in FIG. 4(A) are used, sufficient connection reliability can be ensured while ensuring insulating properties and causing no voids next to the pads.

Regarding the thickness of the insulating film 4, it is preferable that the thickness of the insulating film 4 be greater than the pad thickness of a pad exposed from a through hole 7 formed by hole-boring. It is preferable that the thickness of an insulating film be 100 to 500 when the pad thickness of a pad is defined as 100. In the case where an insulating film 4 thinner than the pad thickness is used, the insulating film thickness is not large enough to keep the insulation distance between layers, which may cause insufficient adhesion between layers or a flow of the conductive material for ensuring electrical connections.

The insulating film 4 may be any film that has insulating properties but is preferably composed of a resin composition containing a polymer component the flowability of which can be controlled, more preferably a thermosetting resin. Furthermore, since it needs to withstand the reflow conditions at the time of component mounting, the glass transition temperature of the cured product is preferably 150° C. or higher, more preferably 180° C. or higher. In order to suppress the coefficient of thermal expansion of the cured product of the insulating film 4, it is preferable that particles, such as a filler, be contained as a reinforcement. Examples of such an insulating film 4 include AS-9500 (product name) and AS-401HS (product name) manufactured by Hitachi Chemical Co., Ltd. In this embodiment, an insulating film is a film composed of a resin composition or a film composed of a resin composition and a filler. The insulating film 4 may further contain fibers. However, in the case where fibers are contained, it is preferable that the length of the fibers be 200 µm or less from the viewpoint of avoiding adverse effects on small-diameter and small-pitch hole processing. It is preferable that the insulating film 4 do not contain a nonwoven fabric composed of glass fiber or carbon fiber, or glass or carbon cloth. In the case where the insulating film 4 containing a nonwoven fabric composed of glass fiber or carbon fiber, or glass or carbon cloth is used, the height varies between the electrical connection pads due to variations in thickness due to the unevenness of density of the nonwoven fabric or the cloth, so that the connection resistance value may be unstable.

<Measurement of Glass Transition Point>

The glass transition temperature can be measured by the following method.

(Sample Fabrication Method)

A thermosetting resin composition is applied on a release PET (A-53 (product name) manufactured by Teijin DuPont Films) using an applicator so that the film thickness after drying would be 100 μm, and the workpiece is dried at a temperature of 130° C. for 30 minutes, thereby fabricating a semi-cured film. Subsequently, the semi-cured film is released from the release PET and fixed by being sandwiched between two metal frames, and the workpiece is dried at a temperature of 185° C. for 60 minutes, thereby fabricating a film of a cured thermosetting resin composition.

(Measuring Method)

Measurement is performed using TMA-2940 (device name) manufactured by TA Instruments, under the following conditions: Jig: pull, distance between chucks: 15 mm, measuring temperature: room temperature to 350° C., rate of temperature increase: 10° C./min, tensile load: 0.05 N, sample size: 5 mm (width)×25 mm (length). The glass transition temperature is determined by the tangent method from the obtained temperature-displacement curve.

(Placement of Conductive Material (1*b*))

Subsequently, as shown in FIG. 2(D), the conductive material 6 is provided on at least one of the facing surfaces of the first printed wiring board 8 and the third printed wiring board 10, and on the electrical connection pads exposed from the through holes 7 formed in the insulating film 4 attached to at least one of the surfaces of the second printed wiring board 9 and the third printed wiring board 10. Although any material that has conductivity may be used as the conductive material 6, it is preferable to use one that melts at a lamination temperature for typical printed wiring boards (200° C. or lower), forms an intermetallic bond between electrical connection pads, and remelts at a temperature of 250° C. or higher after the formation. Examples of the conductive material 6 include HT-710 (product name) manufactured by ORMET Co., Ltd. and MPA500 (product name) manufactured by TATSUTA Electric Wire and Cable Co., Ltd.

(Heat Treatment Before Lamination Step)

The conductive material 6 can be provided in the through holes 7 formed in the insulating film 4 by the screen printing method or dispenser method. Some conductive materials 6 are composed of a binder resin mixed with a metal material and thus maintain viscosity, facilitating screen printing or dispenser processing. When such a conductive material 6 is used, it is preferable to perform heat treatment after the placement of the conductive material 6 to keep the shape of the conductive material, and to preliminarily cure the binder resin to increase the viscosity. Heat treatment can be performed at a temperature of 70 to 150° C. for 10 to 120 minutes so that the viscosity is increased and the shape is maintained. If the temperature is lower than 70° C. and the time is shorter than 10 minutes, the viscosity cannot be sufficiently increased and the shape may collapse in some cases. In addition, if the temperature is higher than 150° C. and the time is longer than 120 minutes, the viscosity becomes too high and the curing of the binder resin proceeds; thus, even if the conductive material 6 melts, a satisfactory intermetallic compound cannot be formed or deformation cannot be achieved at the time of lamination, so that sufficient connectivity may not be ensured in some cases.

<Lamination Step (II)>

Next, as shown in FIG. 3(A), one first printed wiring board 8, at least one third printed wiring board 10, and one second printed wiring board 9 are laminated in this order so that the surface on which the conductive material 6 is provided and the surface on which the conductive material 6 is not provided face to each other (IIa), and heating and pressurizing lamination is performed (IIb) as shown in FIG. 3(B). Consequently, an electrical connection is established by bonding between the electrical connection pads between the respective printed wiring boards through the conductive material 6. When one having a protective film, such as a release film 5, on the surface of the insulating film 4 is used, the protective film is released before the boards are overlaid on one another.

At the time of lamination, it is preferable that a plurality of alignment holes be provided in the same positions on the planes of the first printed wiring board 8, the second printed wiring board 9, and the third printed wiring board 10; pins, which are shorter than the board thickness of the multilayer wiring board after lamination and longer than the total thickness of the laminated first printed wiring board 8 and the third printed wiring board 10, be inserted into the alignment holes in the first printed wiring board 8; and the pins be inserted into the alignment holes provided in the third printed wiring board 10 and further into the alignment holes provided in the second printed wiring board 9 so that lamination is achieved while performing alignment between the printed wiring boards, thereby attaining accurate alignment between the printed wiring boards.

There are no restrictions on the size and shape of each printed wiring board and the number of layers of conductor, and the multilayer wiring board 11 may be manufactured by combining printed wiring boards in different sizes or shapes.

This embodiment can provide a manufacturing method in which at least two printed wiring boards are integrally laminated together and an electrical connection is established between the printed wiring boards, thereby easily fabricating a high-density printed wiring board having excellent connection reliability, a large board thickness, small-diameter holes with small pitches for electrical connections, and minute junction terminal pitches.

EXAMPLES

Example 1

FIG. 1 shows the flow of a manufacturing process according to Example 1 of the present invention.

Eleven inner layer substrates (not shown in the drawing) were fabricated each using an epoxy resin-based copper-clad laminate which has a resin layer thickness of 0.1 mm, a copper foil thickness of 18 μm, and a size of 510 mm×510 mm (MCL-E-679 (product name) manufactured by Hitachi Chemical Co., Ltd. ("MCL" is a registered trademark)) and being provided with wiring circuits on both sides.

Next, the configuration alignment between the boards was performed by the pin lamination method, and an electrolytic copper foil (YGP-18 (product name) manufactured by Nippon Denkai, Ltd.,) having a thickness of 18 μm and a size of 540 mm×540 mm was used as the outermost layer, and two sheets of prepreg of a plurality of aforementioned inner layer substrates and resin layers (GEA-679 (product name) manufactured by Hitachi Chemical Co., Ltd.) having a size of 510 mm×510 mm and a nominal thickness of 0.03 mm which were alternately laminated were used as the innermost layer. Afterwards, the workpiece was heated and pressurized for pressing in a vacuum press machine to be integrated, and the workpiece was cut into a substrate size of 500 mm×500 mm in order to remove the prepreg resin extending out of the edge surfaces, thereby forming a multilayer wiring board having a board thickness of 3.0 mm.

Next, using a drill having a diameter of 0.15 mm and a blade length of 4.0 mm, holes having a depth of 1.8 mm were bored from one surface of the board according to the position of the inner layer, and holes having a depth of 1.8 mm were bored from the other surface according to the positions of the holes on in one surface to obtain through holes. At this time, the minimum pitch of through holes was set to 0.40 mm.

Next, smears in the holes were removed by permanganic acid treatment, and through-hole plating with a thickness of 30 μm was formed using thick electroless copper plating.

Next, the through holes were resin-filled with a hole-filling resin (THP-100DX1 (product name) manufactured by Taiyo Ink Mfg. Co., Ltd.) by the screen printing method using a vacuum printing machine, and then subjected to 30-μm lid plating by thick electroless copper plating.

Next, the copper foil was etched by the tenting method to form a surface layer circuit, thereby providing a first printed wiring board. At this time, electrical connection pads and non-connection pads between the printed wiring boards were provided on the surface layer surface.

Next, the second printed wiring board and the third printed wiring board were formed using the same material composition and process as those of the first printed wiring board. At this time, electrical connection pads and non-connection pads between the printed wiring boards were provided on the surface layer surface.

Next, using an NC control hole-boring machine, holes having a hole diameter of 0.30 mm were bored with a drill in a thermosetting resin-based insulating film (AS-401HS (product name) manufactured by Hitachi Chemical Co., Ltd.) having a size of 510 mm×510 mm, a nominal thickness of 0.065 mm, and a PET film having a thickness of 0.025 mm on one side.

Next, the insulating films in which the holes were bored using a drill were placed on the surfaces of the first printed wiring board and the third printed wiring board on which the electrical connection pads between the printed wiring boards were placed, so that the electrical connection pads were exposed, and was attached thereto using a vacuum laminator at a temperature of 85° C. with a pressure of 0.5 MPa for a pressurization time of 30 seconds (with 30-seconds vacuuming).

Next, using a screen printing machine, the holes bored in the insulating films were filled with a conductive material (MPA500 (product name) manufactured by TATSUTA Electric Wire and Cable Co., Ltd) by the screen printing method. The number of holes that were filled was 20000. At this time, the screen plate was a metal mask having a thickness of 0.1 mm, and an opening of 490 mm×490 mm serving as a printing area. Further, the PET film attached to the surface of the insulating film was used as a protective mask for the portions of the surface of the board where no MPA500 was placed.

Next, the 0.025-mm-thick PET films adhering to the surfaces of the insulating films were released from the insulating material.

Next, the first printed wiring board, the second printed wiring board, and the third printed wiring board were overlaid on one another, and laminated by heating and pressurization pressing using a vacuum press under the following press conditions: at a temperature of 180° C. for 90 minutes with a pressure of 3 MPa, thereby bonding them to each other. At this time, the third printed wiring board was overlaid on the surface of the first board on which MPA500 was provided, so that the surface of the third printed wiring board on which electrical connection pads were provided and no MPA500 was provided faced thereto, and the second printed wiring board was overlaid on the surface of the third board on which MPA500 was provided, so that the surface of the second printed wiring board on which electrical connection pads were provided and no MPA500 was provided faced thereto.

Example 2

A multilayer wiring board was manufactured in the same manner as in Example 1 except that the polyimide based multilayer material MCL-I-671 ((product name) manufactured by Hitachi Chemical Co., Ltd.) and the prepreg GIA-671 ((product name) manufactured by Hitachi Chemical Co., Ltd.) were used for the inner layer substrates.

Example 3

A multilayer wiring board was manufactured in the same manner as in Example 1 except that AS-9500 manufactured by Hitachi Chemical Co., Ltd. was used for the insulating film.

Example 4

A multilayer wiring board was manufactured in the same manner as in Example 1 except that a $CO_2$ laser processing machine was used for hole-boring of the insulating film.

Example 5

A multilayer wiring board was manufactured in the same manner as in Example 1 except that preliminary drying conditions: at a temperature of 70° C. for 10 minutes after printing with the conductive material, were added.

Example 6

A multilayer wiring board was manufactured in the same manner as in Example 1 except that preliminary drying conditions for the conductive material were changed to at a temperature of 150° C. for 120 minutes.

Example 7

A multilayer wiring board was manufactured in the same manner as in Example 1 except that heating and pressurization pressing using alignment pins (having a length of 4.5 mm) was performed at the time of the heating and pressurization pressing.

Example 8

A multilayer wiring board was manufactured in the same manner as in Example 1 except that no metal mask was used as a protective mask at the time of printing with the conductive material.

Example 9

A multilayer wiring board was manufactured in the same manner as in Example 1 except that a multi-wire wiring board was used as the fabricated first printed wiring board and second printed wiring board.

Example 10

A multilayer wiring board was manufactured in the same manner as in Example 1 except that at the time of the heating and pressurization pressing, heating and pressurization pressing using alignment pins (having a length of 4.5 mm) was used, the first printed wiring board and second printed wiring board in which the portions not provided with electrical connection pads but provided on the surface provided with the electrical connection pads are filled with an undercoat ink manufactured by San-ei Kagaku Co., Ltd. (product name: UC-3000) were used, and no metal mask was used as a protective mask at the time of printing with the conductive material.

Example 11

A multilayer wiring board was manufactured in the same manner as in Example 1 except that, instead of the first printed wiring board and the second printed wiring board of Example 1, the first printed wiring board, the second printed wiring board, and at least one third printed wiring board are used and at least a total of three printed wiring boards are used.

Comparative Example 1

Using a glass epoxy multilayer material (E-679 (product name) manufactured by Hitachi Chemical Co., Ltd.), a 26-layer wiring board having a board size of 500 mm×500 mm and a thickness of 3.0 mm was formed. Using a drill having a diameter of 0.15 mm, 20000 holes were bored with a pattern with a minimum pitch of 0.40 mm between the through holes. The inner walls of the holes were copper-plated for establishing an electrical connection, and all the holes were resin-filled with a hole-filling resin (THP-100DX1 (product name) manufactured by Taiyo Ink Mfg. Co., Ltd.). Subsequently, thick electroless copper plating with a thickness of 40 µm was given as lid plating. On one of the surface layers of each board, electrical connection pads with a diameter of 0.30 mm to be present between printed wiring boards were provided in the positions corresponding to the through holes. Further, holes with a diameter of 5.0 mm were provided in positions in the four corners of a 490 mm×490 mm area on the board. This board was used as a first printed wiring board.

Next, a 26-layer wiring board having a board thickness of 3.0 mm was formed using the same material and process as those of the first printed wiring board, thereby providing a second printed wiring board. At this time, on one of the surface layers of the second printed wiring board, electrical connection pads with a diameter of 0.30 mm to be present between printed wiring boards were provided in the positions corresponding to the 20000 through holes. Further, holes with a diameter of 5.0 mm were provided in positions in the four corners of a 490 mm×490 mm area on the board.

Next, a glass cloth substrate prepreg having a nominal thickness of 0.06 mm (GEA-679F (product name) manufactured by Hitachi Chemical Co., Ltd.) was used, and holes with a finished diameter of 0.25 mm were bored in this prepreg by using a $CO_2$ laser processing machine.

Next, the holes provided in the prepreg were filled with a conductive material (MPA500 (product name) manufactured by TATSUTA Electric Wire and Cable Co., Ltd) by using a metal mask.

Next, the first printed wiring board, the prepreg with the holes filled with the conductive material, and the second printed wiring board were overlaid on one another, and the workpiece was heated and pressurized for pressing by a vacuum press under the following press conditions: at a temperature of 180° C. for 90 minutes with a pressure of 3 MPa, thereby bonding them to each other. At this time, they were arranged so that the surfaces of the first printed wiring board and the second printed wiring board on which the electrical connection pads were provided faced each other, and they were overlaid on one another so that the prepreg was sandwiched between the first printed wiring board and the second printed wiring board. The positional alignment between the first printed wiring board, the prepreg, and the second printed wiring board was performed by inserting pins, which have a length of 5 mm and a diameter of 5.0 mm, in 5.0-mm-diameter alignment holes preliminarily drilled in positions in the four corners of a 490 mm×490 mm area on the planes of the first printed wiring board, the prepreg, and the second printed wiring board.

Comparative Example 2

Using a glass epoxy multilayer material (E-679 (product name) manufactured by Hitachi Chemical Co., Ltd.), a 26-layer wiring board having a board size of 500 mm×500 mm and a thickness of 3.0 mm was formed. Using a drill having a diameter of 0.15 mm, 20000 holes were bored with a pattern with a minimum pitch of 0.40 mm between the through holes. The inner walls of the holes were copper-plated for establishing an electrical connection, and all the holes were resin-filled with a hole-filling resin (THP-100DX1 (product name) manufactured by Taiyo Ink Mfg. Co., Ltd.). Subsequently, thick electroless copper plating with a thickness of 40 µm was given as lid plating. On one of the surface layers of each board, electrical connection pads with a diameter of 0.25 mm to be present between printed wiring boards were provided in the positions corresponding to the through holes. Further, holes with a diameter of 5.0 mm were provided in positions in the four corners of a 490 mm×490 mm area on the board. This board was used as a first printed wiring board.

Next, a 26-layer wiring board having a board thickness of 3.0 mm was formed using the same material and process as those of the first printed wiring board, thereby providing a second printed wiring board. At this time, on one of the surface layers of the second printed wiring board, electrical connection pads with a diameter of 0.30 mm to be present between printed wiring boards were provided in the positions corresponding to the 20000 through holes. Further, holes with a diameter of 5.0 mm were provided in positions in the four corners of a 490 mm×490 mm area on the board.

Next, a eutectic solder paste (M705-WSG36-T5K (product name) manufactured by Senju Metal Industry Co., Ltd.) was screen-printed on the electrical connection pads on the first printed wiring board by using a metal mask, and the workpiece was subjected to reflow treatment at a peak temperature of 235° C. for five seconds, thereby forming angle solder bumps having a height of 0.13 mm.

Next, the first printed wiring board, an insulating film having a nominal thickness of 0.060 mm (AS-401HS (product name) manufacture by Hitachi Chemical Co., Ltd.), and the second printed wiring board were overlaid on one another, and the workpiece was heated and pressed by a vacuum press under the following press conditions: at a temperature of 180° C. for 90 minutes with a pressure of 3 MPa, thereby bonding them to each other. At this time, printed wiring boards are overlaid on one another so that solder bumps formed on the first printed wiring board and electrical connection pads on the second printed wiring board faced each other, an insulating film (AS-401HS (product name) manufactured by Hitachi Chemical Co., Ltd.) having a nominal thickness of 0.075 mm is sandwiched between the first printed wiring board and the second printed wiring board, and an insulating material was passed through angle solder bumps for connection. Further, the positional alignment between the printed wiring boards was performed by inserting pins, which have a length of 5 mm and a diameter of 5.0 mm, in 5.0-mm-diameter holes preliminarily drilled in positions in the four corners of a 490 mm×490 mm area on the planes of the first printed wiring board and the second printed wiring board.

Comparative Example 3

A glass cloth substrate prepreg (GEA-679F (product name) manufactured by Hitachi Chemical Co., Ltd.) having a nominal thickness 0.06 mm was used. The prepreg was placed on the surface of the first printed wiring board on which the electrical connection pads to be present between the printed wiring boards were placed, so that the prepreg was brought in contact with the electrical connection pads, and was attached thereto using a vacuum press at a temperature of 150° C. with a pressure of 1.0 MPa for a pressurization time of 30 minutes with vacuuming. In addition, the printing with a conductive material employed a metal mask having openings, which have the same diameter as the holes in the insulating film, in the positions corresponding to only the holes provided with the conductive material. Aside from that, a multilayer wiring board was manufactured in the same conditions as in Example 1.

The characteristics of the boards manufactured in Examples and Comparative Examples were evaluated as follows.

A board with 50 daisy chain patterns including bonding points of 400 holes and inner layer connections between the bonded first printed wiring board, second printed wiring board, and third printed wiring board were used as an evaluation pattern. Regarding the connection resistance value, the resistance value was measured at the starting end point and the ending end point of one daisy chain pattern by using a milliohm meter, and the measured resistance value was then divided by 400 holes to determine the connection resistance value for one point. This operation was performed on all the 50 blocks to determine the average.

Regarding the reflow heat resistance, one block was cut out of the daisy chain patterns and the treatment was carried out three times at a peak temperature of 235° C. for five seconds by using a reflow apparatus. After the reflow treatment, the connection resistance value was measured using a milliohm meter.

The evaluation results for Examples are shown in Table 1.

TABLE 1

| Example | Initial continuity test | Connection resistance value | Reflow heat resistance | Resistance value after reflow |
|---|---|---|---|---|
| 1 | Passed | 3.5 | Passed | 3.6 |
| 2 | Passed | 3.7 | Passed | 3.8 |
| 3 | Passed | 3.6 | Passed | 3.7 |
| 4 | Passed | 3.4 | Passed | 3.5 |
| 5 | Passed | 3.9 | Passed | 4.0 |
| 6 | Passed | 3.2 | Passed | 3.3 |
| 7 | Passed | 3.5 | Passed | 3.6 |
| 8 | Passed | 4.0 | Passed | 4.1 |
| 9 | Passed | 3.1 | Passed | 3.2 |
| 10 | Passed | 3.5 | Passed | 3.5 |
| 11 | Passed | 3.7 | Passed | 3.8 |

It was proved that the manufacturing methods of Examples enable easy manufacture of a high-density multilayer wiring board having excellent connection reliability, a large board thickness, small-diameter holes with small pitches for electrical connections, and minute junction terminal pitches.

The evaluation results for Comparative Examples are shown in Table 2.

TABLE 2

| Comparative Example | Initial continuity test | Connection resistance value | Reflow heat resistance | Resistance value after reflow |
|---|---|---|---|---|
| 1 | Failed | — | — | — |
| 2 | Failed | — | — | — |
| 3 | Failed | — | — | — |

Regarding the board obtained in Comparative Example 1, a connection failure occurred at 50 points out of the 20000 connection points. This was caused by the fact that height variations between the electrical connection pads occurred due to unevenness in the thickness of the nonwoven fabric due to the unevenness of density and the conductive material was partly not in contact. Regarding the board obtained in Comparative Example 2, a connection failure occurred at 200 points out of the 20000 connection points. This was caused by the fact that pressure was applied to conductive bumps, so that breakage of the conductive bumps occurred and the bumps were prevented from appropriately passing through due to variations in the heights of the bumps and the warpage of the printed wiring board. Regarding the board obtained in Comparative Example 3, a connection failure occurred at 100 points out of the 20000 connection points. This was caused by, as in Comparative Example 1, the fact that height variations between the electrical connection pads occurred due to unevenness in the thickness of the nonwoven fabric and the conductive material was partly not in contact. Another cause was partial misalignment of the positions of the provided conductive material due to use of a metal mask.

REFERENCE SIGNS LIST

1 . . . support base material, 2 . . . pad, 2a . . . electrical connection pad, 2b . . . non-connection pad, 3 . . . hole-filling resin, 4 . . . insulating film, 5 . . . release film, 6 . . . conductive material, 7 . . . through hole, 8 . . . first printed wiring board, 9 . . . second printed wiring board, 10 . . . third printed wiring board, 11 . . . multilayer wiring board.

The invention claimed is:

1. A method for manufacturing a multilayer wiring board, the method comprising steps of:
   preparing a plurality of printed wiring boards having both electrical connection pads for establishing an electrical connection between the plurality of printed wiring boards and non-connection pads for not establishing an electrical connection between the plurality of printed wiring boards on the same plane; and
   overlaying the plurality of printed wiring boards so that the electrical connection pads face each other, and laminating the plurality of printed wiring boards so that the plurality of printed wiring boards are bonded to each other through a conductive material provided between the facing electrical connection pads,
   wherein, in the preparing, to at least one of surfaces faced when the plurality of printed wiring boards are overlaid in the overlaying, an insulating film having through holes formed in positions corresponding to the electrical connection pads on the surface is attached, and the conductive material is provided in the through holes formed in the insulating film, and
   wherein, the preparing further comprising attaching insulating films to both of the facing surfaces when the plurality of printed wiring boards are overlaid in the overlaying, an insulating film of the insulating films having through holes provided in positions corresponding to only the electrical connection pads is used for one of the facing surfaces, and the insulating film having through holes provided in positions corresponding to both the electrical connection pads, and the non-connection pads is used for other facing surface.

2. The method for manufacturing a multilayer wiring board according to claim 1, wherein in the preparing, the insulating films include a thermosetting resin composition having a glass transition temperature of 180° C. or more.

3. The method for manufacturing a multilayer wiring board according to claim 1, wherein in the preparing, the insulating films include particles, such as a filler as a reinforcement.

4. The method for manufacturing a multilayer wiring board according to claim 1, wherein in the preparing, the through holes formed in the insulating film in the positions corresponding to the pads for establishing an electrical connection between the plurality of printed wiring boards are formed by laser hole-boring or drilling hole-boring.

5. The method for manufacturing a multilayer wiring board according to claim 1, wherein in the preparing, a PET film is used as a protective mask when the conductive material is provided in the through holes formed in the insulating film.

6. The method for manufacturing a multilayer wiring board according to claim 1, wherein in the preparing, the plurality of printed wiring boards are subjected to heat treatment at a temperature of 70 to 150° C. for 10 to 120 minutes, after the conductive material is provided in the through holes formed in the insulating film and before the overlaying of the plurality of printed wiring boards.

7. The method for manufacturing a multilayer wiring board according to claim 1, wherein in the overlaying, a plurality of alignment holes are provided in common portions on the planes of the plurality of printed wiring boards, and pins are inserted into the provided alignment holes, so that the lamination is performed while performing alignment between the plurality of printed wiring boards.

8. The method for manufacturing a multilayer wiring board according to claim 1, wherein in the overlaying, portions on the surface provided with the electrical connection pads are filled with an insulating material, the portions being not provided with the electrical connection pads.

9. The method for manufacturing a multilayer wiring board according to claim 1, wherein in the preparing, upon attachment of the insulating film with the through holes, a thickness of the insulating film attached to the printed wiring board is larger than a pad thickness of the electrical connection pads exposed from the through holes formed in the insulating film.

10. The method for manufacturing a multilayer wiring board according to claim 1, wherein in the preparing, when the conductive material is provided in the through holes, the through holes formed in the insulating film in positions corresponding to the electrical connection pads are all filled by providing the conductive material.

* * * * *